(12) United States Patent
Suga et al.

(10) Patent No.: US 7,591,293 B2
(45) Date of Patent: Sep. 22, 2009

(54) DEVICE FOR BONDING A METAL ON A SURFACE OF A SUBSTRATE

(75) Inventors: Tadatomo Suga, c/o The University of Tokyo, School of Engineering, 7-3-1, Hongo, Bunkyo-ku, Tokyo, 113-8656 (JP); Toshihiro Ito, Tokyo (JP); Akira Yamauchi, Shiga (JP)

(73) Assignees: Tadatomo Suga, Tokyo (JP); Toray Engineering Co., Ltd., Osaka (JP); Oki Electric Industry Co., Ltd., Tokyo (JP); Sanyo Electric Industry Co., Ltd., Osaka (JP); Sharp Kabushiki Kaisha, Osaka (JP); Sony Corporation, Tokyo (JP); Kabushiki Kaisha Toshiba, Tokyo (JP); Fujitsu Limited, Kanagawa (JP); Matsushita Electric Industrial Co., Ltd., Osaka (JP); Rohm Co., Ltd., Kyoto (JP); Renesas Technology Corp., Tokyo (JP)

( * ) Notice: Subject to any disclaimer, the term of this patent is extended or adjusted under 35 U.S.C. 154(b) by 763 days.

(21) Appl. No.: 10/528,690
(22) PCT Filed: Sep. 22, 2003
(86) PCT No.: PCT/JP03/12070

§ 371 (c)(1),
(2), (4) Date: Mar. 22, 2005

(87) PCT Pub. No.: WO2004/030076

PCT Pub. Date: Apr. 8, 2004

(65) Prior Publication Data

US 2006/0085965 A1 Apr. 27, 2006

(30) Foreign Application Priority Data

Sep. 24, 2002 (JP) ............................. 2002-276986

(51) Int. Cl.
*G05G 15/00* (2006.01)
*B23K 1/14* (2006.01)
*B23K 26/00* (2006.01)

(52) U.S. Cl. ........................... 156/351; 29/729; 29/739; 29/840; 156/368; 156/382; 228/49.2; 228/180.21; 228/1.1; 219/121.45

(58) Field of Classification Search .............. 29/603.06, 29/603.2, 623.4, 593, 843, 860, 877, 832, 29/831, 729, 739, 840; 428/96, 102, 103, 428/336, 344, 301, 295; 156/60, 160, 244.26, 156/244.27, 251, 273.3, 351, 358, 382; 204/192.38, 204/298.41; 257/459, 676, 707, 779–782; 228/180.21, 180.22, 1.1, 49.2; 219/121.46, 219/121.45; 451/5, 35, 164

See application file for complete search history.

(56) References Cited

U.S. PATENT DOCUMENTS 2,791,429 A 5/1957 Perec et al.
(Continued)

FOREIGN PATENT DOCUMENTS

JP  5-235061 A  9/1993
(Continued)

*Primary Examiner*—Minh Trinh
*Assistant Examiner*—Tai Nguyen
(74) *Attorney, Agent, or Firm*—Smith Patent Office (57) ABSTRACT

A device and method for bonding objects to be bonded each having a metal bonding portion on a substrate, comprising cleaning means for exposing the metal bonding portions to a plasma having an energy enough to etch the surfaces of the metal bonding portions at a depth of 1.6 nm or more over the entire surfaces of the metal bonding portions under a reduced pressure and bonding means for bonding the metal bonding portions of the objects taken out of the cleaning means in an atmospheric air. By using a specific scheme, metal bonding portions after the plasma cleaning can be bonded in the atmospheric air, thereby significantly simplifying the bonding process and the whole device and lowering the cost.

1 Claim, 5 Drawing Sheets

U.S. PATENT DOCUMENTS

| | | | | |
|---|---|---|---|---|
| 4,992,847 A | * | 2/1991 | Tuckerman | 257/623 |
| 5,384,018 A | * | 1/1995 | Ramm et al. | 204/192.38 |
| 5,714,252 A | * | 2/1998 | Hogerton et al. | 428/344 |
| 5,767,577 A | * | 6/1998 | Nihei et al. | 257/707 |
| 5,802,699 A | * | 9/1998 | Fjelstad et al. | 29/593 |
| 5,919,561 A | * | 7/1999 | Fuchs et al. | 428/336 |
| 6,218,736 B1 | | 4/2001 | Yagi et al. | |
| 2001/0001428 A1 | | 5/2001 | Yagi et al. | |

FOREIGN PATENT DOCUMENTS

| | | |
|---|---|---|
| JP | 6-338535 A | 12/1994 |
| JP | 2791429 B | 8/1998 |
| JP | 11-340614 A | 12/1999 |
| JP | 2000-77569 A | 3/2000 |
| JP | 2001-44606 A | 2/2001 |
| JP | 2001-110850 A | 4/2001 |
| JP | 2001-259884 A | 9/2001 |
| JP | 3207506 B | 9/2001 |

* cited by examiner

DEVICE FOR BONDING A METAL ON A SURFACE OF A SUBSTRATE

TECHNICAL FIELD OF THE INVENTION

The present invention relates to bonding device and method for bonding objects to be bonded each having a metal bonding portion on a surface of a substrate, such as chips, wafers or various circuit boards.

BACKGROUND ART OF THE INVENTION

As a method for bonding objects to be bonded each having a bonding portion, Japanese Patent 2,791,429 discloses a bonding method of silicon wafers for, at the time of bonding the bonding surfaces of the silicon wafers to each other, sputter etching the bonding surfaces by irradiating an inert gas ion beam or an inert gas high-speed atomic beam to the surfaces at a vacuum condition with a room temperature prior to the bonding. In this bonding method, oxides or organic substances on the bonding surfaces of the silicon wafers are removed by the above-described beam and the surfaces are formed by atoms activated by the beam, and both surfaces are bonded to each other by a strong bonding force between the activated atoms. Therefore, in this method, basically heating for bonding is not necessary, and it is possible to bond the objects at a room temperature or a low temperature close to the room temperature merely by bringing the activated surfaces into contact with each other.

In this bonding method, however, the bonding of the etched bonding surfaces must be carried out in a vacuum at a condition where the surface activated state is maintained. Therefore, the predetermined vacuum condition must be maintained from the surface cleaning by the above-described beam to the bonding, and in particular, because at least a part of the mechanism for bonding must be constructed in a chamber capable of maintaining the predetermined vacuum degree, a large-scale sealing mechanism is required, and the whole of the device becomes large and expensive. Further, if it is tried to carry out the surface cleaning and the bonding at different places for separating the surface cleaning process by the above-described beam and the bonding process from each other, it is required to maintain a predetermined vacuum condition between both places and mean for conveying the objects from a cleaning place to a bonding place while maintaining the predetermined vacuum condition is required, and therefore, it becomes difficult to design a practical device and the whole of the device becomes large.

DISCLOSURE OF THE INVENTION

Accordingly, paying attention to the above-described problems, as the result of investigation and examination for particularly simplifying the bonding step while ensuring the merit in the bonding due to the above-described surface activation of the bonding surface as much as possible, the inventors of the present invention have succeeded to bond the metal bonding portions of objects to be bonded in an atmospheric air.

Namely, an object of the present invention is to clean metal bonding portions of objects to be bonded by a specific scheme as well as to enable to carry out the bonding after the cleaning in an atmospheric air, and in particular, to simplify the bonding device and the whole device and lower the cost.

To accomplish the above object, a bonding device according to the present invention for bonding objects to be bonded each having a metal bonding portion on a surface of a substrate, comprises cleaning means for exposing the surfaces of the metal bonding portions to a plasma having an energy enough to etch the surfaces of the metal bonding portions at a depth of 1.6 nm or more over the entire surfaces of the metal bonding portions under a reduced pressure, and bonding means for bonding the metal bonding portions of the objects taken out of the cleaning means to each other in an atmospheric air.

In this bonding device, it is preferred that the above-described bonding means has heating means and bonds the metal bonding portions to each other at a temperature of 180° C. or lower, preferably, a temperature lower than 150° C. Although it is preferred that the objects can be bonded at a room temperature without heating, because it is considered that, by heating, the atomic movement for bonding is more activated and the bonding surfaces are more softened to close fine gaps between the bonding surfaces more easily, there is a case where using such a heating together is preferred. However, even if the heating is carried out, because it may be carried out at a temperature of 180° C. or lower, preferably, a temperature lower than 150° C., the load to the device may be small. Namely, although a typical conventional example for bonding at a low temperature is to use a solder and it has been necessary to heat the solder at a temperature of 183° C., which is the melting point of the solder, or higher, in the present invention, the bonding at a temperature of such a temperature or lower (180 ° C. or lower, preferably, lower than 150° C.) becomes possible. Especially, in a case where the metal bonding portion is gold, bonding at 100° C. or lower becomes possible.

Further, in this bonding device, it is preferred that the surfaces of the metal bonding portions to be bonded to each other are both formed from gold. The whole of electrodes, etc. forming the metal bonding portions may be formed from gold, and only the surfaces thereof may be formed from gold. The formation for forming the surfaces from gold is not particularly restricted, and the formation of gold plating or a thin gold film formed by sputtering or deposition may be employed.

In the bonding device according to the present invention, the cleaning means comprises means for irradiating a plasma at an energy capable of etching the surfaces of the metal bonding portions at a depth of 1.6 nm or more over the entire surfaces of the metal bonding portions to be bonded. By plasma irradiation at such an etching energy or more, it becomes possible to conduct a surface etching necessary to bond the metal bonding portions to each other in an atmospheric air. Further, as the cleaning means, an argon plasma irradiating means is suitable, which can easily control the plasma intensity and which can a desired plasma efficiently at a required place.

The above-described bonding means is preferably means for making a dispersion of a gap between the metal bonding portions at the time of bonding to be 4 μm or less at maximum. If the dispersion of the gap is 4 μm or less, it becomes possible to suppress the gap within a dispersion of gap required for bonding the metal bonding portions to each other, by an appropriate bonding load.

Further, the above-described bonding means is preferably means for making a surface roughness of at least one metal bonding portion after bonding to be 10 nm or less by applying an appropriate bonding load. If the surface roughness is made at 10 nm or less, it becomes to bond at a low temperature, for example, at a room temperature. Further, in order to achieve such a surface roughness after bonding of 10 nm or less, it is necessary to prevent an excessive surface roughness before bonding, and for example, it is preferred that the surface roughness of at least one metal bonding portion before bonding is made to be 100 nm or less.

The bonding load is preferably suppressed at a practically adequate value or less, for example, in order to prevent bumps from being broken or from being deformed excessively, particularly, in order to prevent a bad affection from being given to a circuit under bumps. Namely, the above-described bonding means is preferably means for bonding the metal bonding portions to each other at a bonding load of 300 MPa or less. Because generally a stress, which a semiconductor circuit can bear, is considered to be 300 MPa, by making the bonding load at 300 MPa or less, the above-described inconvenience can be avoided.

Further, in order to achieve a good close contact between surfaces when the metal bonding portions are bonded to each other, it is preferred that the surface hardness of the metal bonding portions is set at 100 or less in Vickers hardness Hv. For example, the surface hardness Hv is preferably in a range of 30 to 70 (for example, an average Hv: 50). By seting the surface at such a low hardness, the surfaces of the metal bonding portions can be appropriately deformed and a closer contact becomes possible.

Further, in the bonding device according to the present invention, in order to achieve a desired electric connection over the entire area of a predetermined region of the bonding surfaces, a good parallelism at the time of bonding becomes an important factor. Therefore, the above-described bonding means is preferably means capable of adjusting the parallelism in a bonding area between substrates at the time of bonding the metal bonding portions to each other at 4 μm or less (4 μm or less as range).

Further, in a case where at least one metal bonding portion is formed by a plurality of bumps, it is preferred that a dispersion of bump height is 4 μm or less (4 μm or less as range). By this, as aforementioned, it becomes possible to suppress the dispersion of the gap between the metal bonding portions at the time of bonding at 4 μm or less.

A bonding method according to the present invention for bonding objects to be bonded each having a metal bonding portion on a surface of a substrate, comprises the steps of exposing the surfaces of the metal bonding portions to a plasma to etch the surfaces of the metal bonding portions at a depth of 1.6 nm or more over the entire surfaces of the metal bonding portions under a reduced pressure, and bonding the metal bonding portions after the plasma treatment to each other in an atmospheric air.

Also in this bonding method, it is preferred that the metal bonding portions are bonded to each other at a temperature of 180° C. or lower, preferably at a temperature lower than 150° C. Further, a formation can be employed wherein the metal bonding portions, the surfaces of which are both formed from gold, are bonded to each other.

Further, in the above-described plasma treatment, in order to carry out a surface etching necessary for bonding the metal bonding portions to each other in an atmospheric air, the entire surface of the metal bonding portions to be bonded is etched at a depth of 1.6 nm or more. As the plasma treatment, an argon plasma treatment can be employed.

Further, it is preferred that the dispersion of the gap between the metal bonding portions at the time of bonding is made to be 4 μm or less at maximum. Further, it is preferred that the surface roughness of at least one metal bonding portion after bonding is made to be 10 nm or less. It is preferred that the surface roughness of at least one metal bonding portion before bonding is made to be 100 nm or less.

With respect to bonding load, it is preferred that the metal bonding portions are bonded to each other at a bonding load of 300 MPa or less. Further, it is preferred that the surface hardness of the metal bonding portions is set at 100 or less in Vickers hardness Hv.

Further, it is preferred that the parallelism in a bonding area between substrates at the time of bonding the metal bonding portions to each other is adjusted at 4 μm or less. In a case where at least one metal bonding portion is formed by a plurality of bumps, it is preferred that the dispersion of bump height is 4 μm or less.

The present invention also provides a bonded material made by the above-described bonding method. Namely, a bonded material according to the present invention is a bonded material of objects bonded to each other each having a metal bonding portion on a surface of a substrate, made by exposing the surfaces of the metal bonding portions to a plasma to etch the surfaces of the metal bonding portions at a depth of 1.6 nm or more over the entire surfaces of the metal bonding portions under a reduced pressure, and after the plasma treatment, bonding the metal bonding portions to each other in an atmospheric air.

In the above-described bonded material, a structure can be employed wherein at least one object comprises a semiconductor.

In the above-described bonding device and method according to the present invention, after the surfaces of the metal bonding portions of the objects to be bonded are treated by a plasma so as to be etched at a depth of 1.6 nm or more, the metal bonding portions cleaned and activated by the etching are bonded to each other in an atmospheric air. Because bonding in an atmospheric air becomes possible, a large-scale vacuum device for bonding and a sealing device therefor are not required, the whole of process and the whole of device are simplified and the cost can be reduced.

This bonding in an atmospheric air can be achieved in practice, as described later in examples, by suppressing the dispersion of the gap between the metal bonding portions at the time of bonding at a small value in addition to the surface cleaning and activation due to the plasma treatment at a predetermined etching energy or more, and further, setting the surface roughness, surface hardness, bonding load, etc. of the metal bonding portions, and by combining these conditions.

Thus, in the bonding device and method according to the present invention, by appropriately setting various conditions and employing the specific scheme according to the present invention as described later, it becomes possible to bond the metal bonding portions after plasma cleaning to each other in an atmospheric air, thereby significantly simplifying the bonding process and the whole device and lowering the cost.

BRIEF EXPLANATION OF THE DRAWINGS

FIG. 2 shows a substrate used in an examination as an object to be bonded.

EXPLANATION OF SYMBOLS

1 : bonding device
2, 3 : metal bonding portion
4, 5 : object to be bonded
6 : vacuum pump
7 : chamber
8 : plasma irradiating means
9 : plasma
10 : Ar gas supplying pump
11 : bonding place
12 : waiting place
13 : turning mechanism
14 : head portion of turning mechanism
15 : bonding head
16 : bonding tool
17 : bonding stage
18 : heater as heating means
19 : cylinder mechanism
20 : vertical guide
21 : lifting device
22 : position adjusting table
23 : two-sight recognition means
25 : bonded material
31 : substrate as object to be bonded
32 : bump
33 : chip as object to be bonded

THE BEST MODE FOR CARRYING OUT THE INVENTION

Hereinafter, desirable embodiments of the present invention will be explained referring to figures.

Figure 1:
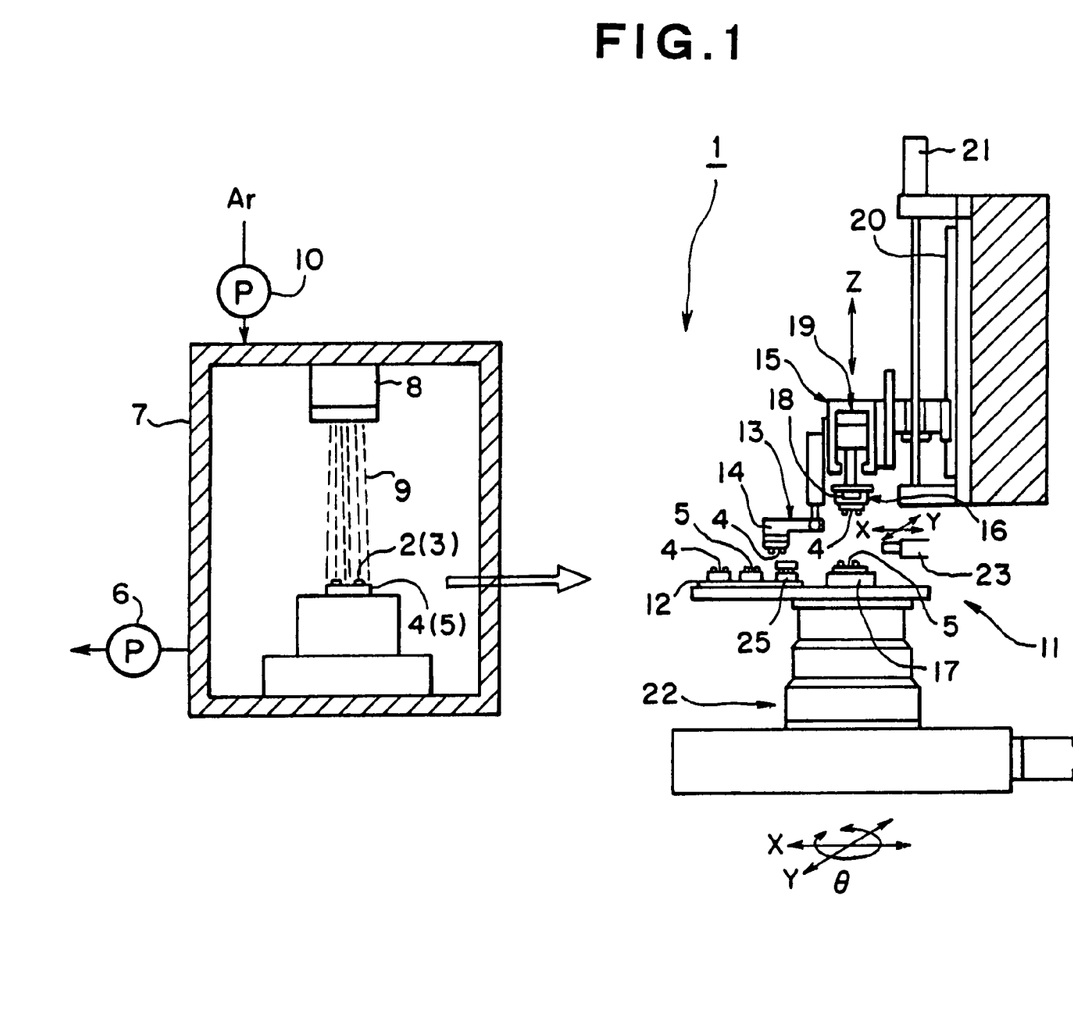
FIG. 1 is a schematic diagram of a bonding device according to an embodiment of the present invention.

FIG. 1 shows a bonding device 1 according to an embodiment of the present invention. An object to be bonded 4 or 5, which has a metal bonding portion 2 or 3 on a surface of a substrate, first, is cleaned in a chamber 7 which is reduced in pressure by a vacuum pump 6 at a predetermined vacuum degree, and the surfaces of metal bonding portions 2 and 3 are cleaned by etching by plasma 9 irradiated from plasma irradiating means 8 as cleaning means (cleaning process). In this cleaning process, metal bonding portions 2 and 3 are plasma treated at an energy capable of etching the entire surfaces of the metal bonding portions 2 and 3 at a depth of 1.6 nm or more. In this embodiment, Ar gas is supplied into chamber 7 by a pump 10, and the plasma treatment is carried out under a condition of Ar gas atmosphere and under a condition of a reduced pressure. Cleaned objects 4 and 5 are taken out of chamber 7, and metal bonding portions 2 and 3 are bonded to each other in an atmospheric air at a bonding process (bonding place 11).

Where, the above-described object to be bonded 4 comprises a chip for example, and the object to be bonded 5 comprises a substrate for example. Where, the "chip" means all objects with forms being bonded to the substrate regardless the kind and size, such as an IC chip, a semiconductor chip, an optoelectronic element, a surface mounting part, a wafer a TCP and an FPC. Further, the "substrate" means all objects with forms being bonded to the chip regardless the kind and size, such as a resin substrate, a glass substrate, a film substrate, a chip and a wafer. As a typical embodiment in the present invention, an embodiment can be raised wherein at least one object among the objects to be bonded is a semiconductor.

In bonding place 11, for example, the above-described cleaned objects 4 and 5 are set at a predetermined waiting place 12. The object 4 is held by suction, etc. by a head portion 14 of a turning mechanism 13 not to touch the cleaned surface, and after turned over vertically, it is held by a bonding tool 16 provided at a lower portion of a bonding head 15, by suction, etc., in a form in which the metal bonding portion 2 is directed downward. The object 5 is held, for example, on a bonding stage 17, by suction, etc., in a form in which the metal bonding portion 3 is directed upward. In this embodiment, a heater 18 is incorporated into bonding tool 16 as heating means, and, in an atmospheric air, bonding at a room temperature and bonding under a heated condition may be both possible.

A cylinder mechanism 19 is incorporated into bonding head 15, and a predetermined bonding load can be applied to object 4 held by bonding tool 16 and can be controlled, in a downward direction, namely, in a direction toward object 5. In this embodiment, bonding head 15 can be moved and positioned in a vertical direction (Z direction) by a lifting device 21 (for example, a device having a servomotor and a ball screw mechanism) along a vertical guide 20.

Further, in this embodiment, bonding stage 17 holding the above-described object 5 can align a position and adjust a parallelism relative to object 4 by controlling a horizontal position in X and Y directions, a rotational position in a θ direction and inclination angles around X and Y axes carried out by a position adjusting table 22 provided at a lower position, and the gap between the metal bonding portions at the time of bonding can be suppressed small. These alignment of the relative position and adjustment of the parallelism are carried out by reading recognition marks (not shown) provided to objects 4 and 5 or the holding means thereof by a recognition means inserted into a position between the objects 4 and 5 at a condition capable of progressing and retreating, for example, a two-sight recognition means 23 (for example, a two-sight camera), and performing a necessary correction in position and angle based on the read information. The two-sight recognition means 23 can be adjusted in position in X and Y directions, and as the case may be, in Z direction. Although these alignment of the relative position and adjustment of the parallelism are carried out mainly at the side of bonding stage 17 in this embodiment, it is possible to carry out these at the side of bonding head 15 or bonding tool 16, and further, at both sides. In a case carried out at both sides, according to requirements, it can be also done that, as to the side of bonding head 15, not only the lifting control but also a rotation control and/or a parallelism control may be carried out, and also as to the side of bonding stage 17, a rotation control, a parallelism control and a lifting control can be carried out, and these control forms may be arbitrarily combined as needed.

Further, in this embodiment, bonded material 25 formed by bonding objects 4 and 5 is also put once on waiting place 12, and therefrom, it is conveyed to a next process or a place for stock by an appropriate conveying mechanism (not shown).

EXAMPLES

Figure 2A:
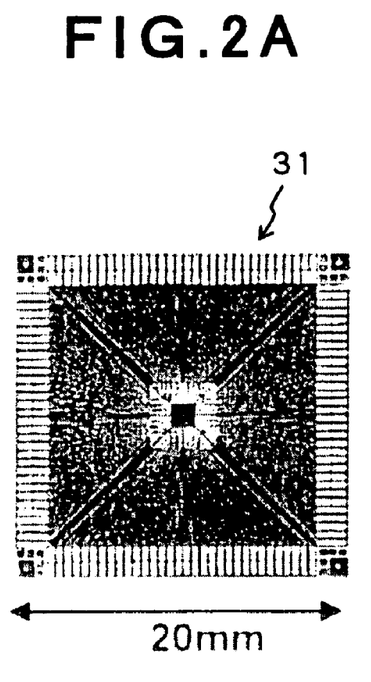
FIG. 2A is a plan view of the whole of the substrate.
Figure 2B:
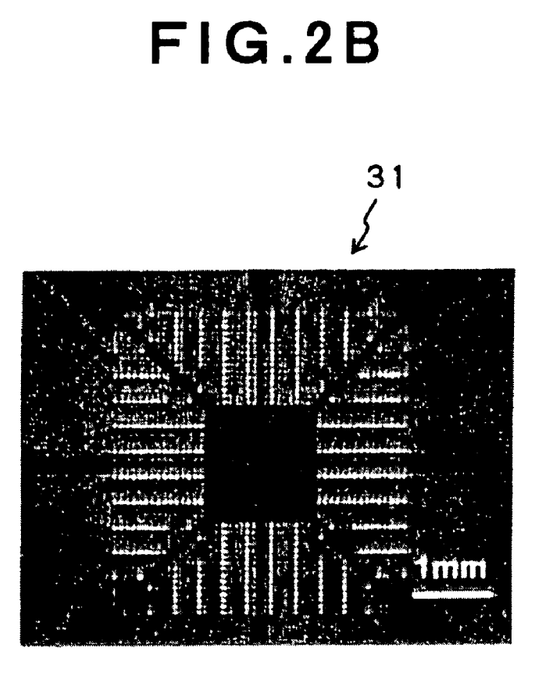
FIG. 2B is an enlarged plan view of a central portion thereof in which many bumps are formed.
Figure 2C:
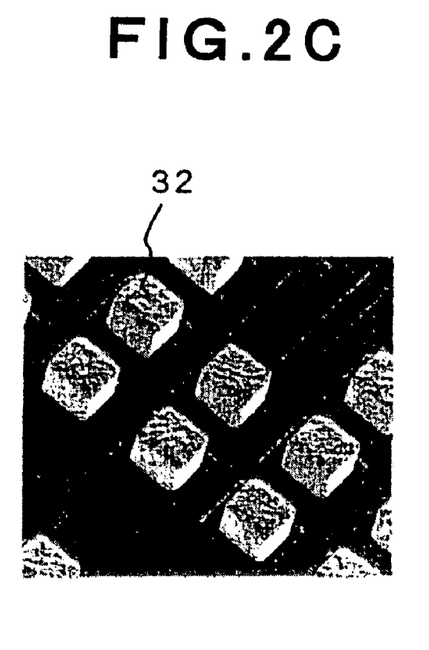
FIG. 2C is an enlarged partial perspective view of the disposed bumps.
Figure 3:
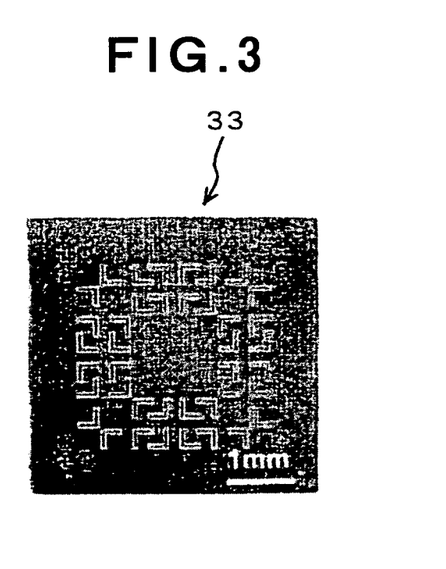
FIG. 3 is a plan view of a chip used in the examination as another object to be bonded.

Using the above-described bonding device, the following examination was carried out with respect to the bonding method according to the present invention. A substrate 31 used in the examination as object to be bonded 5 is shown in FIG. 2, FIG. 2A shows a plan view of the whole of the substrate 31, FIG. 2B shows an enlarged plan view of a central portion thereof in which many bumps are formed, and FIG. 2C shows an enlarged partial perspective view of disposed bumps 32, respectively. A chip 33 used in the examination as object to be bonded 4 is shown in FIG. 3, and in it, a predetermined circuit pattern is formed corresponding the group of bumps 32 in the central portion of the substrate.

The specifications of these substrate and chip are as follows.

Substrate: Si substrate, Au plated bumps are formed on an Al pad.
Size of substrate: 20 mm×20 mm
Bump forming region: within 4 mm×4 mm in a central portion
Size of bump: 40 μm×40 μm×height 30 μm (80 μm pitch)
Number of bumps: 400 (refer to FIG. 2B as to bump pattern)
Chip: Au sputter film (Au—0.3 μm/Cr—0.1 μm) on a Si thermally oxidized substrate
Size: 6 mm×6 mm (pattern forming region: within 4 mm×4 mm in a central portion)
L-type electrode pattern is formed for three terminal determination. (As the value of resistance described later, the connected resistance at a corner of the L-type pattern is measured, each side; 10×4)

Under the following conditions, as to the effect for activating the surfaces of the metal bonding portions due to a short-time plasma irradiation, comparison examinations of bonding in a nitrogen atmosphere and bonding in an atmospheric air after surface cleaning by the plasma treatment were carried out, and the influence due to the plasma irradiating time in the bonding in each atmosphere was determined as an average connected resistance and a die shear strength. As to bonding in an atmospheric air, bonding after leaving for 3.5 minutes and bonding after leaving for 15 minutes after plasma treatment were examined. The results are shown in Tables 1 and 2 and FIGS. 4 and 5.

Conditions of examination for determining the effect due to plasma treatment:
Plasma deposition electric power: 100 W
Ar flow rate: 30 cc/m
Vacuum degree at the time of introducing Ar: 10 Pa
Vacuum degree at the time of irradiation: 7.5 Pa or less
Bonding load: 20 kgf (50 gf/bump, 300 MPa)
Time for applying load: 1 second
Bonding temperature: 100° C. (373 K)
Maximum value of dispersion of height of electrodes in chip: 2.3 μm
Maximum value of dispersion of height of bumps in Si substrate: 3.0 μm

TABLE 2

Variation of resistance due to irradiating time (mΩ)

| Electric power (W) | Atmosphere | Amount of exposure (min.) | Irradiating time (sec.) | | | |
|---|---|---|---|---|---|---|
| | | | 5 | 10 | 30 | 60 |
| 100 | atmospheric air | 3.5 | 7.28 | 6.57 | 6.72 | 6.90 |
| 50 | atmospheric air | 3.5 | 6.84 | — | — | — |
| 100 | nitrogen | 3.5 | 6.94 | 6.4 | 6.1 | 6.92 |
| 100 | nitrogen | 15 | — | 6.86 | 6.70 | — |
| 100 | atmospheric air | 15 | — | 6.40 | 6.48 | — |

Figure 4:
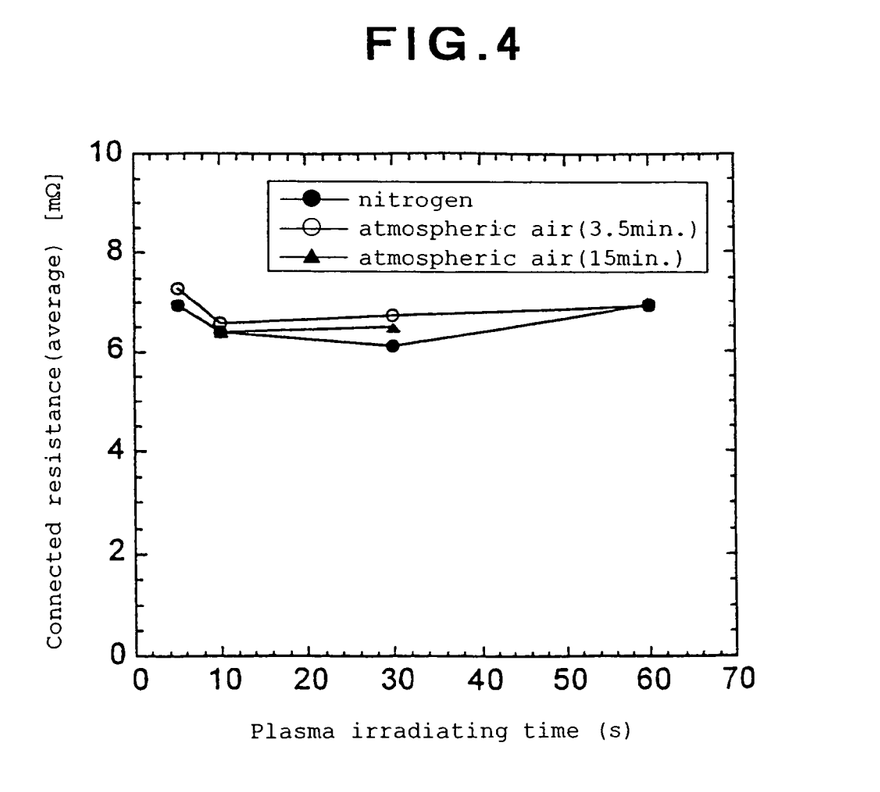
FIG. 4 is a graph showing a relationship between plasma irradiating time and connected resistance.
Figure 5:
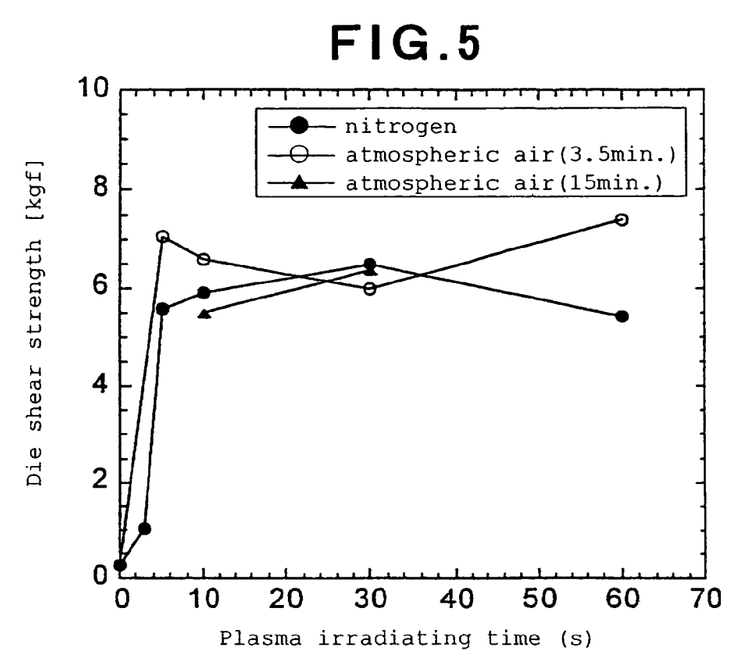
FIG. 5 is a graph showing a relationship between plasma irradiating time and die shear strength.

As shown in Table 2 and FIG. 4, even in a case of being bonded in an atmospheric air after being left for 15 minutes after plasma treatment, a bonding similar to the bonding in nitrogen was possible, and it was confirmed that a sufficiently good bonding could be carried out in an atmospheric air. Further, as shown in Table 1 and FIG. 5, it was confirmed that a time of about 5 seconds or more was enough as the time of the plasma irradiation.

Further, as the result of investigating the relationship between the plasma irradiation and the depth of etching on the surface of the Au plated bump as the surface to be bonded, the depth was about 20 nm/min. in a case of a plasma deposition electric power of 50 W, and the depth was about 30 nm/min. in a case of a plasma deposition electric power of 100 W. In any deposition electric power, as described above, bonding in an atmospheric air was possible by a time of the plasma irradiation of about 5 seconds or more. Therefore, it was confirmed that 1.6 nm (=20 nm×[5 seconds/60 seconds]) or more was enough as the etching depth for enabling the bonding in an atmospheric air.

Figure 6:
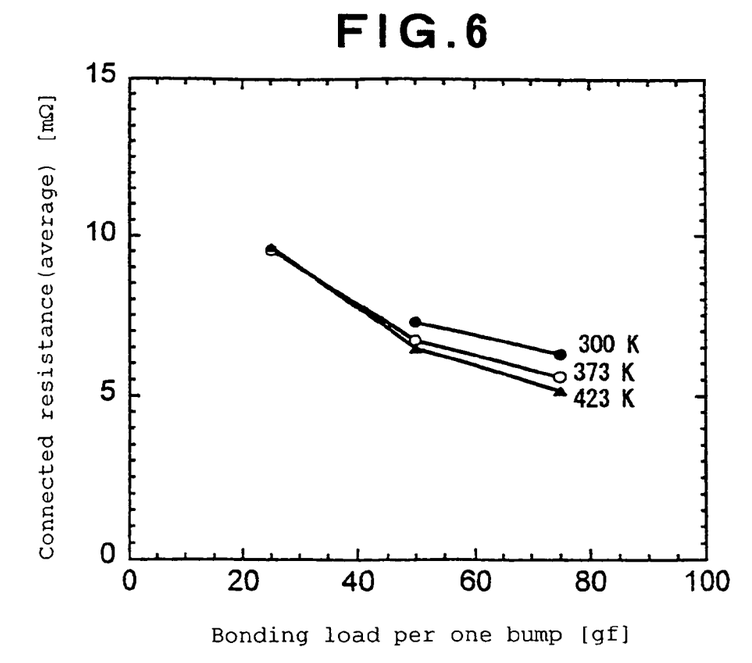
FIG. 6 is a graph showing a relationship between bonding load and connected resistance per one bump.
Figure 7:
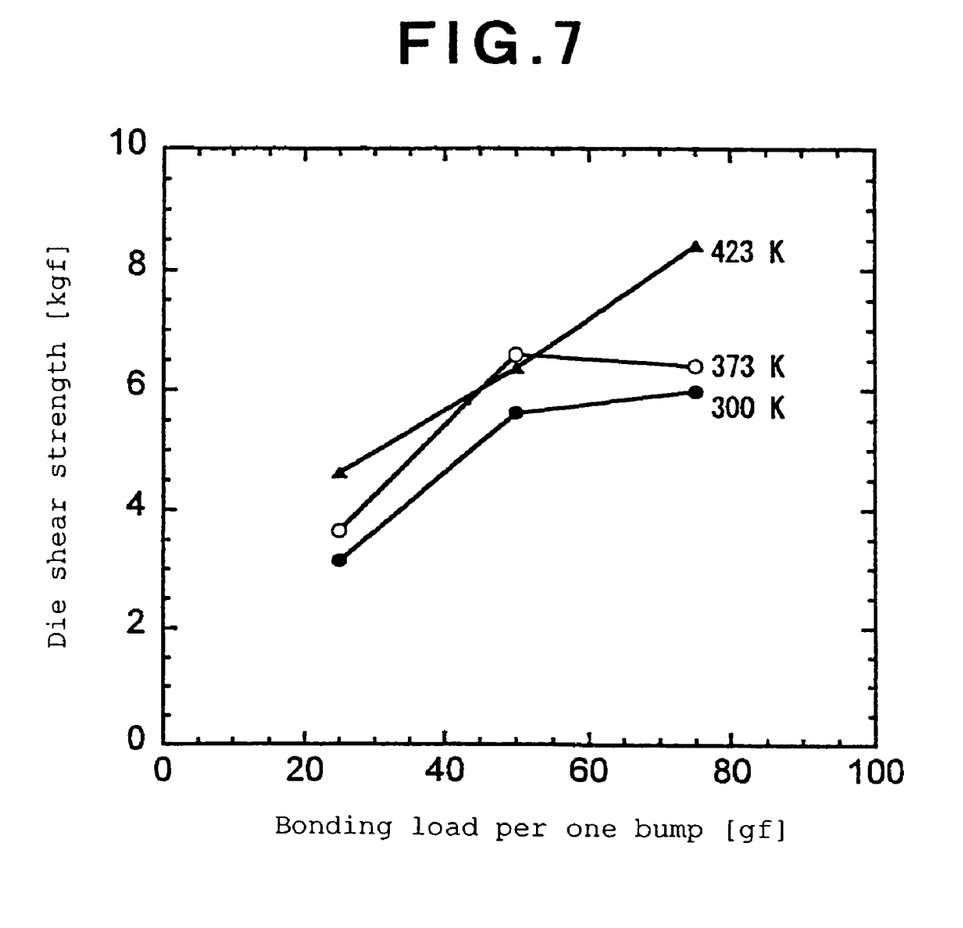
FIG. 7 is a graph showing a relationship between bonding load and die shear strength per one bump.

Further, Tables 3 and 4 and FIGS. 6 and 7 show the relationships between the bonding load per one bump and the obtained connected resistance or die shear strength using a bonding temperature as the parameter. The conditions for the examination are as follows.

Bonding in an atmospheric air
Time for applying load: 1 second
Plasma deposition electric power: 100 W
Irradiating time: 30 seconds
Leaving (exposure) time after irradiation: 3.5 minutes Other conditions are the same as those aforementioned.

TABLE 1

Variation of die shear strength due to irradiating time (gf)

| Electric power (W) | Atmosphere | Amount of exposure (min.) | Irradiating time (sec.) | | | | | |
|---|---|---|---|---|---|---|---|---|
| | | | 0 | 3 | 5 | 10 | 30 | 60 |
| 100 | atmospheric air | 3.5 | 258 | — | 7058 | 6595 | 6008 | 7406 |
| 100 | nitrogen | 3.5 | 252 | 1035 | 5587 | 5896 | 6507 | 5427 |
| 100 | nitrogen | 15 | — | — | — | 5510 | 6373 | — |
| 100 | atmospheric air | 15 | — | — | — | 5730 | 5212 | — |
| 50 | atmospheric air | 3.5 | 241 | 3550 | 5855 | — | — | — |

TABLE 3

Variation of resistance due to load (mΩ)

| Temperature | Load (kgf) | | |
|---|---|---|---|
| | 10 | 20 | 30 |
| 300 K (27° C.) | — | 7.28 | 6.28 |
| 373 K (100° C.) | 9.55 | 6.72 | 5.58 |
| 423 K (150° C.) | 9.65 | 6.47 | 5.15 |

TABLE 4

Variation of die shear strength due to load (gf)

| Temperature | Load (kgf) | | |
|---|---|---|---|
| | 10 | 20 | 30 |
| 300 K (27° C.) | 3151 | 5626 | 5984 |
| 373 K (100° C.) | 3656 | 6595 | 6406 |
| 423 K (150° C.) | 4626 | 6366 | 8406 |

It was confirmed that, even if the bonding load per one bump was 50 gf or less, it was possible to obtain a sufficiently practical connection state at a low resistance, the die shear strength was enough, and it was possible to obtain a sufficiently practical connection state even at a temperature of 100° C. (373 K) or lower, or even at a temperature near a room temperature (27° C., 300 K).

Further, Table 5 shows the relationship between the bonding load per one bump and the surface roughness of the bump after bonding. Because this surface roughness of the bump after bonding is hard to be determined if actually bonded, it is determined simulatively by applying a bonding load without plasma irradiation and measuring the surface roughness of the bump surface after being deformed by pressing due to the bonding load. It is considered that a bump surface roughness after bonding of 10 nm or less is preferable in order to obtain a connection state at a sufficiently low resistance. To achieve this, from Table 5, it is understood that applying of a load of about 20 kgf is enough and a lower load is possible, and this value corresponds to a bonding load per one bump of 50 gf. Therefore, it is understood that it is possible to achieve the bump surface roughness after bonding of 10 nm or less even by a bonding load per one bump of 50 gf or less. Namely, it is possible even by a bonding load of 300 MPa or less. However, in order to achieve such a bump surface roughness of 10 nm or less after pressing, a bump surface roughness before bonding is preferably 100 nm or less.

TABLE 5

Variation of surface roughness of bump (nm)

| Temperature | Load (kgf) | | | | |
|---|---|---|---|---|---|
| | 0 | 5 | 10 | 20 | 30 |
| 300 K (27° C.) | — | 137 | 82 | 6 | 5 |
| 373 K (100° C.) | — | 145 | 76 | 5 | 4 |

By the above-described examination, it was confirmed that, in the present invention, the bonding in an atmospheric air was possible after plasma irradiation by setting various conditions appropriately.

INDUSTRIAL APPLICATIONS OF THE INVENTION

The bonding device and method according to the present invention can be applied to any bonding of objects to be bonded each having a metal bonding portion, and in particular, the bonding device and method are suitable for bonding in a case where at least one object is a semiconductor.

The invention claimed is:

1. A device for bonding objects to be bonded each having a metal bonding portion on a surface of a substrate, comprising:

cleaning means for exposing the surfaces of the metal bonding portions to a plasma having an energy enough to etch the surfaces of the metal bonding portions at a depth of 1.6 nm or more over the entire surfaces of the metal bonding portions under a reduced pressure, wherein said cleaning means includes an argon plasma irradiating means; and bonding means for bonding the metal bonding portions of the objects taken out of said cleaning means to each other in an atmospheric air, wherein said bonding means includes a heating mechanism capable of heating the bonding portions to a temperature of 180° C. or lower, wherein said bonding means includes a dispersion means for making a dispersion of a gap between the metal bonding portions at the time of bonding to be 4 μm or less at a maximum, wherein said bonding means includes a roughness means for making a surface roughness of at least one metal bonding portion after bonding to be 10 nm or less, wherein said bonding means includes an adjusting means for bonding the metal bonding portions to each other at a bonding load of 300 MPa or less, wherein said bonding means includes means capable of adjusting a parallelism in a bonding area between substrates at the time of bonding the metal bonding portions to each other at 4 μm or less, and wherein the surfaces of the metal bonding portions to be bonded to each other are both formed from gold, a surface roughness of at least one metal bonding portion before bonding is made to be 100 nm or less, and the metal bonding portions have 100 or less in Vickers hardness and are in a form of a plurality of bumps, wherein the bumps of each of the metal bonding portions have a dispersion of bump height of 4 μm or less.

* * * * *